United States Patent [19]
Narimatsu

[11] Patent Number: 5,646,452
[45] Date of Patent: Jul. 8, 1997

[54] REGISTRATION ACCURACY MEASUREMENT MARK FOR SEMICONDUCTOR DEVICES

[75] Inventor: Koichiro Narimatsu, Hyogo, Japan

[73] Assignee: Mitsubishi Denki Kabushiki Kaisha, Tokyo, Japan

[21] Appl. No.: 477,835

[22] Filed: Jun. 7, 1995

[30] Foreign Application Priority Data

Oct. 18, 1994 [JP] Japan .................. 6-252080

[51] Int. Cl.$^6$ .................................. H01L 23/544
[52] U.S. Cl. .................................. 257/797
[58] Field of Search .............. 257/797; 428/195, 428/209, 689

[56] References Cited

U.S. PATENT DOCUMENTS 5,308,682  5/1994  Morikawa .................. 257/797

FOREIGN PATENT DOCUMENTS

0061536B1  10/1982  European Pat. Off. .

*Primary Examiner*—Carl W. Whitehead, Jr.
*Attorney, Agent, or Firm*—Lowe, Price, LeBlanc & Becker

[57] ABSTRACT

A registration accuracy measurement mark has a first measurement mark, a second measurement mark, and a third measurement mark arranged in different layers in a layered manner. The first measurement mark includes a first sidewall and a second sidewall in parallel along a Y direction. The second measurement mark includes a third sidewall and a fourth sidewall in parallel along an X direction. The third measurement mark includes a fifth sidewall and a sixth sidewall in parallel along the X direction, and a seventh sidewall and an eighth sidewall in parallel along the Y direction. Registration accuracy measurement in both the X and Y directions can be carried out at the same time even when the measurement of registration accuracy in the X and Y directions respectively is directed to different layers.

7 Claims, 14 Drawing Sheets

FIG.1
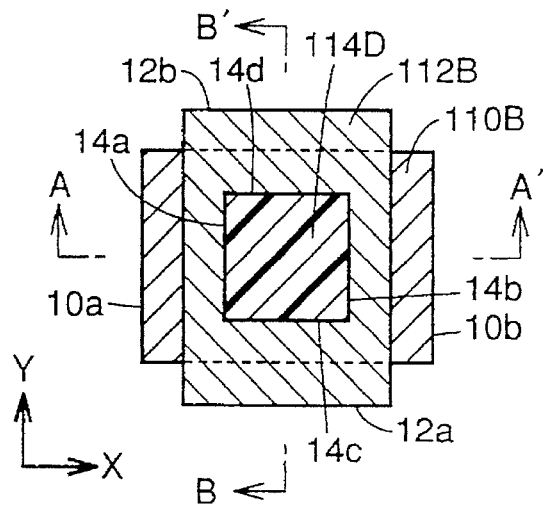
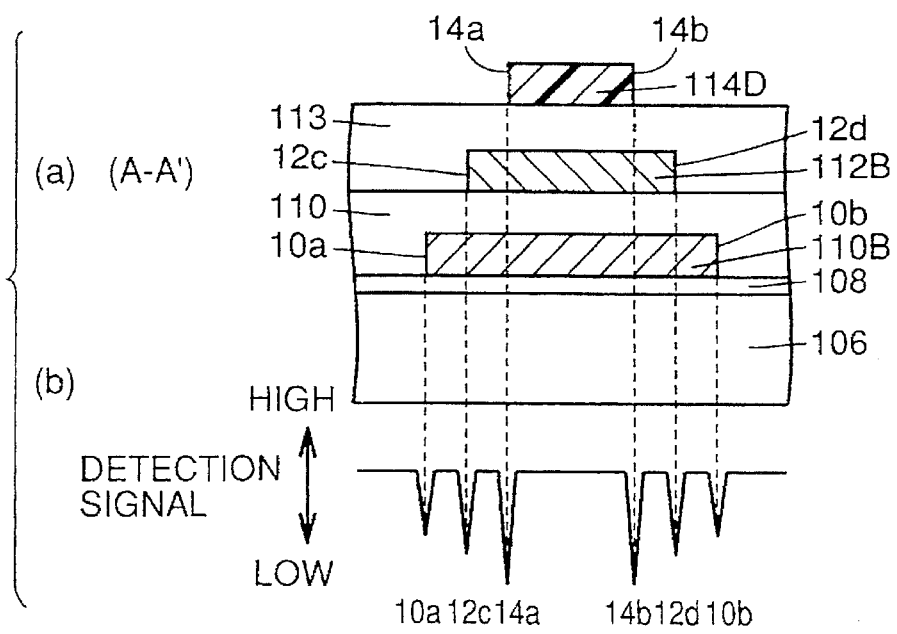
FIG.2

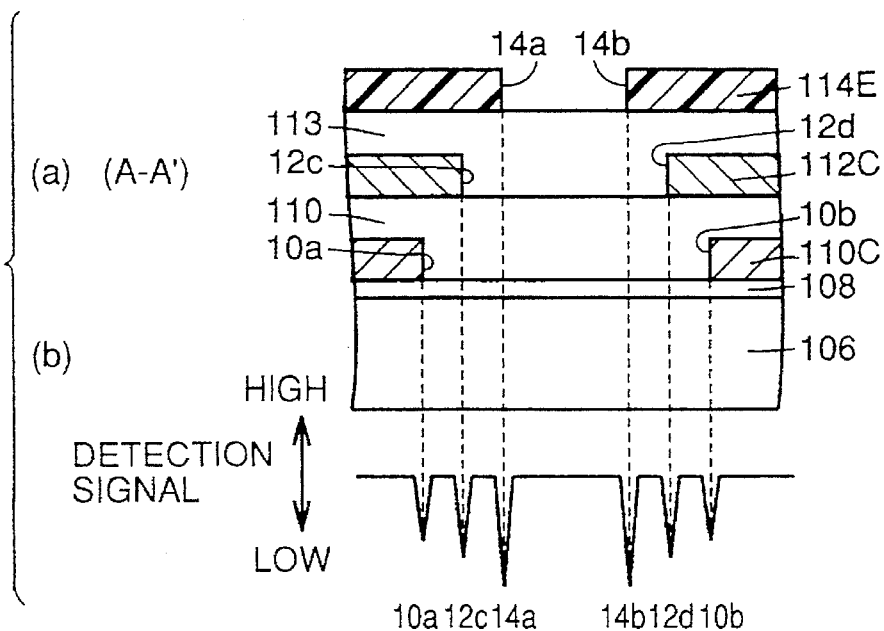
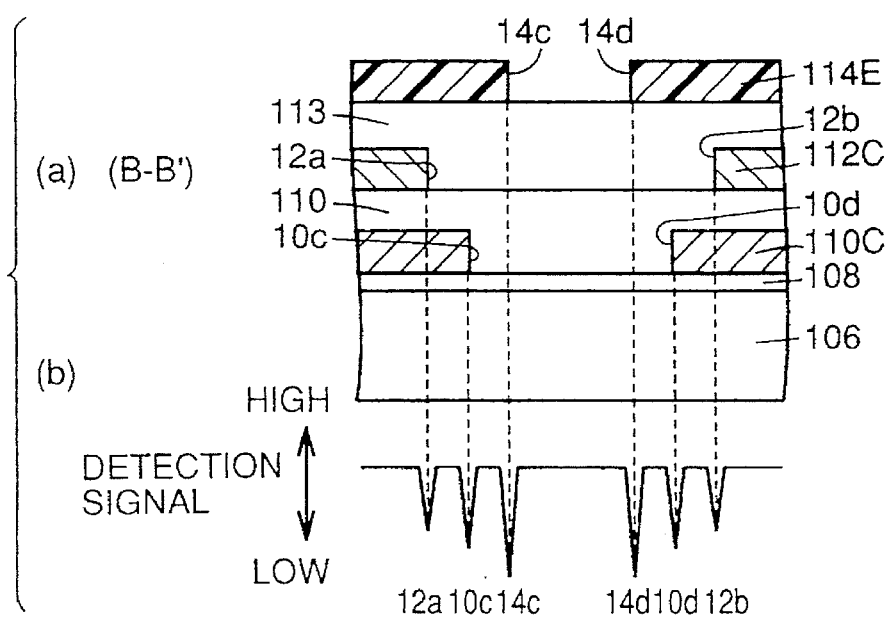

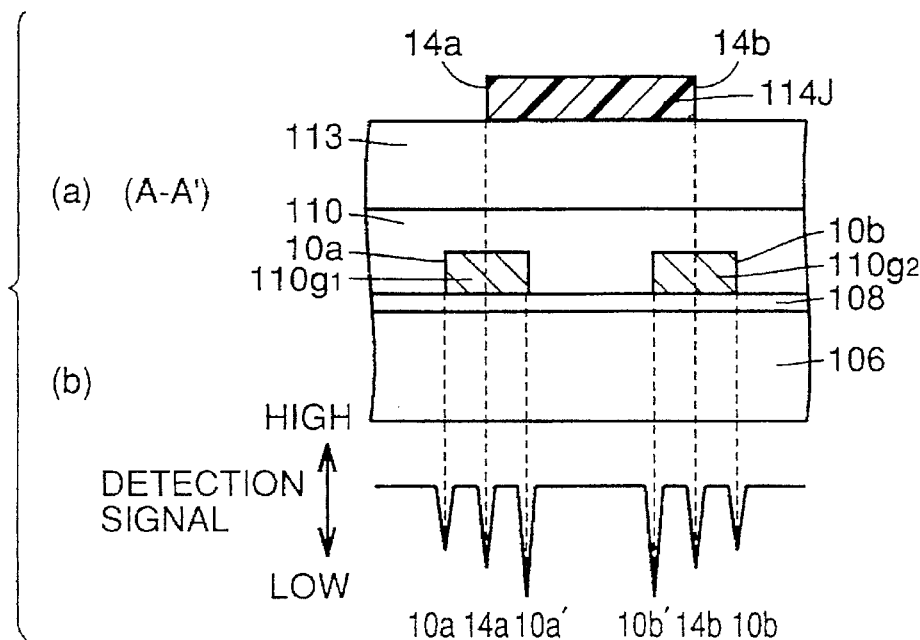
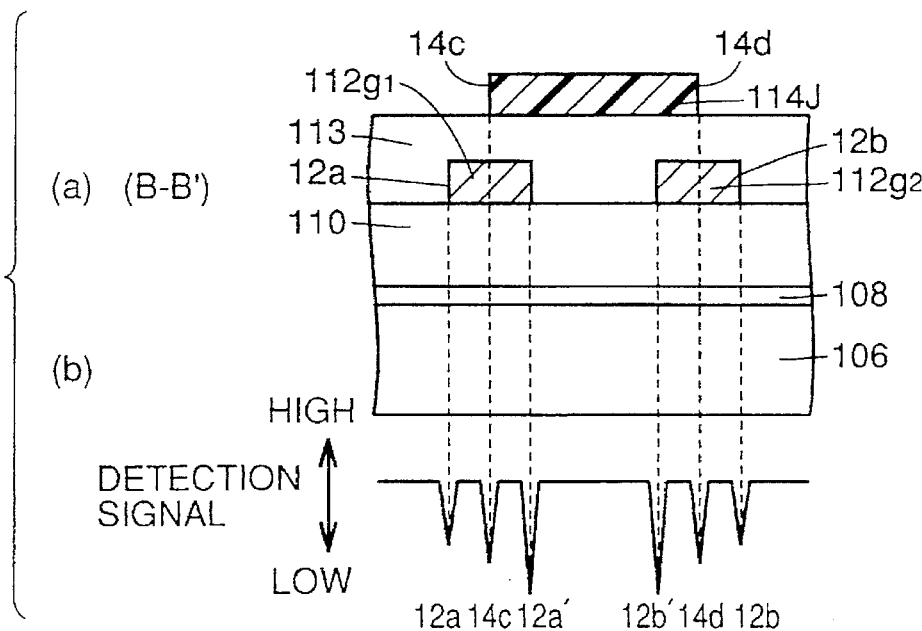

REGISTRATION ACCURACY MEASUREMENT MARK FOR SEMICONDUCTOR DEVICES

BACKGROUND OF THE INVENTION

1. Field of the Invention

The present invention relates to a registration accuracy measurement mark, and more particularly, to a structure of a registration accuracy measurement mark.

2. Description of the Background Art

In recent years, the registration accuracy of layers in a device formed of a plurality of layers has become more critical in accordance with miniaturization of the dimension of the device. A registration accuracy measurement mark used for the purpose of assessing the registration accuracy will be described hereinafter for an MOS transistor.

FIG. 22 shows a vertical sectional view of a general MOS transistor, and FIG. 23 shows a plan view of a semiconductor device in which such an MOS transistor is provided. The structure of an MOS transistor will be briefly described with reference to FIGS. 22 and 23. On a semiconductor substrate 106, a word line 110a serving as a gate electrode is formed with a gate oxide film 108 thereunder. Source/drain regions 107 are formed at semiconductor substrate 106.

A bit line 112A is provided above gate electrode 110A with an interlayer oxide film 110 therebetween. Bit line 112A is electrically connected to one of source/drain regions 107. Word line 110A and bit line 112A are arranged so as to be at right angles to each other as shown in FIG. 23. An interlayer oxide film 113 is formed on bit line 112A.

Formation of a contact hole 104 in an active region 115 between word lines 110A and bit lines 112A disposed at intervals of 1 μm respectively in a semiconductor device of the above structure will be described hereinafter with reference to FIG. 23.

The dimension of contact hole 104 formed in the semiconductor device is 0.5 μm×0.5 μm. When word line 110A, bit line 112A and contact hole 104 are formed in accurate registration as designed, the distance of X between word line 110A and contact hole 104 in the X direction and the distance of Y between bit line 112A and contact hole 104 in the Y direction are both 0.25 μm.

However, contact hole 104 may be formed offset in position in some cases. When there is offset in position, a portion of contact hole 104 will be formed on bit line 110A and bit line 112A.

Contact hole 104 is formed including the steps of patterning a resist film 114A formed on interlayer oxide film 113 by lithography, and providing a contact hole using the patterned resist film 114A as a mask. At the stage of patterning resist film 114A, the offset in position of the contact hole pattern formed by resist film 114A with respect to the positions of word lines 110A and bit line 112A can be measured, and then reproduce only the resist film if the contact hole pattern of the resist film is not formed accurately.

However, since the distance between contact hole 104 and word line 110A, and the distance between contact hole 104 and bit line 112A are as small as 0.25 μm, it was extremely difficult to measure the registration accuracy of this region.

According to a conventional method of measuring the registration accuracy of the contact hole pattern of a resist film with respect to a word line or a bit line, a registration accuracy measurement mark is provided in the periphery of the region where a semiconductor device is formed as a dummy pattern for measuring the accuracy in the region. This registration accuracy measurement mark is formed simultaneous to the formation process of a word line, a bit line, and a resist film. The registration accuracy is assessed on the basis of this registration accuracy measurement mark.

This registration accuracy measurement mark will be described hereinafter with reference to FIGS. 24–26. First, the arrangement of a registration accuracy measurement mark will be described with reference to FIG. 24. In a peripheral region of a semiconductor device, a first measurement mark 110B is formed at a predetermined position on a gate oxide film 108 simultaneous to the formation step of word line 110A. The plane configuration of first measurement mark 110B has a square pattern of 20 μm×20 μm as shown in FIG. 25(a). Also, a second measurement mark 112B is formed at a predetermined position on an interlayer oxide film 110 simultaneous to the step of forming bit line 112A. The plane configuration of second measurement mark 112B has a square pattern of 20 μm×20 μm as shown in FIG. 26(a).

Above first measurement mark 110B and second measurement mark 112B, third and fourth measurement marks 114B and 114C are formed on interlayer insulation film 113 simultaneous to the respective patterning steps of respective resist films.

Third and fourth measurement marks 114B and 114C have a square pattern of 10 μm×10 μm as shown in FIGS. 25(a) and 26(a), respectively.

Measurement of registration accuracy using first, second, third, and fourth measurement marks 110B, 112B, 114B, and 114C, respectively, will be described with reference to FIGS. 25 and 26.

FIG. 25 relates to the registration accuracy between word line 110A and the contact hole pattern of a resist film. It is appreciated from FIG. 23 that the registration accuracy between word line 110A and contact hole pattern is crucial in the X direction.

In FIG. 25, (a) shows a plan view of third measurement mark 114B, and (b) shows the intensity of light by a detection signal taken along lines A–A' of (a) when light is directed to third measurement mark 114B. It is appreciated from FIG. 25 that intensity of light according to a detection signal is low at positions corresponding to sidewalls $10a$, $10b$, $11a$, and $11b$ of first and third measurement marks 110B and 114B. The registration accuracy in the X direction is measured according to this detection signal.

For example, a middle point $c_1$ of the detection signals of sidewalls $10a$ and $10b$, and a middle point $c_2$ of detection signals of sidewalls $11a$ and $11b$ are obtained. When the positions of middle points $c_1$ and $c_2$ match, the offset between first registration mark 110B and third registration mark 114B in the X direction is 0. An offset between the positions of middle points $c_1$ and $c_2$, if any, corresponds to the amount of offset between first and third measurement marks 110B and 114B in the X direction. Similarly, the amount of offset in the Y direction between second and fourth measurement marks 112B and 114C is obtained as shown in FIG. 26(a) and (b).

The measured results using first, second, the fourth measurement marks 110B, 112B, 114B, and 114C have a one to one correspondence with respect to the amount of offset of word line 110A, bit line 112A, and the contact hole pattern of the resist film. They can be taken directly as the registration accuracy.

The above-described measuring method using a registration accuracy marks requires the provision of two types of measurement marks at different positions, i.e. a measurement mark for measuring the registration accuracy in the X direction, and a measurement mark for measuring the registration accuracy in the Y direction. This means that a region for forming this measurement mark is necessary.

When the registration accuracy is measured using light, individual measurement steps must be carried out since the layers subject to measurement in the X direction and measurement in the Y direction differs. The measurement process is time consuming, and becomes a bottle neck in reducing the overall manufacturing time required for a semiconductor device.

SUMMARY OF THE INVENTION

An object of the present invention is to provide a registration accuracy measurement mark that allows measurement of registration accuracy in both X and Y directions at the same time even when the registration accuracy measurement in the X direction and the Y direction is carried out on the basis of different layers.

A registration accuracy measurement mark according to an aspect of the present invention includes a first measurement mark formed in a first layer on a semiconductor substrate, a second measurement mark formed in a second layer on the first layer substantially above the first measurement mark, and a third measurement mark formed in a third layer on the second layer substantially above the first and second measurement marks used with the first measurement mark for measuring the offset between the first and third layers in an X direction and used with the second measurement mark for measuring the offset between the second layer and the third layer in a Y direction. Furthermore, the first measurement mark includes first and second sidewalls arranged in parallel with a first distance therebetween along the Y direction. The second measurement mark includes third and fourth sidewalls arranged in parallel with a second distance therebetween along the X direction. The third measurement mark includes fifth and sixth sidewalls arranged in parallel with a third distance therebetween differing from the first distance along the Y direction, and seventh and eighth sidewalls arranged in parallel along the X direction with a fourth distance therebetween differing from the second distance.

When observation light is directed to first, second, and third measurement marks, the intensity of the observation light at each portion of the first sidewall to the eighth sidewall is lowered, and predetermined signals can be observed. The respective distances and middle points of first and second sidewalls, third and fourth sidewalls, fifth and sixth sidewalls, and seventh and eighth sidewalls can be read out from these signals. By comparing the position of the middle point of the first and second sidewalls with the position of the middle point of the fifth and sixth sidewalls, the registration accuracy between the first and third measurement marks in the X direction can be measured. Simultaneously, by comparing the middle point position of the third and fourth sidewalls with the middle point position of the seventh and eighth sidewalls, the registration accuracy between the second and third measurement marks in the Y direction can be measured. Thus, the registration accuracy in different layers of the X direction and the Y direction can be measured at one emission of observation light.

Preferably, the fifth and sixth sidewalls of the third measurement mark are disposed in a region sandwiched by the first and second sidewalls of the first measurement mark, and the seventh and eighth sidewalls of the third measurement mark are disposed in a region sandwiched by the third and fourth sidewalls of the second measurement mark.

More preferably, the first measurement mark has a measurement pattern of substantially a rectangle defined by the first and second sidewalls. The second measurement mark has a measurement pattern of substantially a rectangle defined by the third and fourth sidewalls. The third measurement mark has a measurement pattern of substantially a square defined by the fifth, the sixth, the seventh, and the eighth sidewalls.

More preferably, the first measurement mark has an opening measurement pattern of substantially a rectangle defined by the first and second sidewalls. The second measurement mark has an opening measurement pattern of substantially a rectangle defined by the third and fourth sidewalls. The third measurement mark has an opening measurement pattern of substantially a square defined by the fifth, the sixth, the seventh, and the eighth sidewalls.

More preferably, the first measurement mark includes a first measurement pattern of substantially a rectangle including the first sidewall and a second measurement pattern of substantially a rectangle including the second sidewall. The second measurement mark includes a third measurement pattern of substantially a rectangle including the third sidewall and a fourth measurement pattern of substantially a rectangle including the fourth sidewall. The third measurement mark includes a fifth measurement pattern of substantially a square defined by the fifth, sixth, seventh, and eighth sidewalls.

According to the registration accuracy measurement mark of the present invention, the observation light of the fifth and sixth sidewalls at an irradiation mode of the observation light exist in a region sandwiched by the observation light of the first and second sidewalls, and the observation light of the seventh and eighth sidewalls exist in a region sandwiched by the observation light of the third and fourth sidewalls. In measuring the registration accuracy on the basis of observation light, the correspondence of observation light with respect to a sidewall is easily identified. The registration accuracy can be measured properly.

In order to achieve the above object, a registration accuracy measurement mark according to another aspect of the present invention has the fifth and sixth sidewalls of the third measurement mark disposed in a region sandwiched by the first and second sidewalls of the first measurement mark, and the third and fourth sidewalls of the second measurement mark disposed in a region sandwiched by the seventh and eighth sidewalls of the third measurement mark.

In order to achieve the above object according to another aspect of a registration accuracy measurement mark of the present invention, the first measurement mark includes a first measurement pattern of substantially a rectangle including the first sidewall and a second measurement pattern of substantially a rectangle including the second sidewall. The second measurement mark includes a third measurement pattern of substantially a rectangle defined by the third and fourth sidewalls, and the third measurement mark includes a fourth measurement pattern of substantially a square defined by the fifth, sixth, seventh, and eighth sidewalls.

According to the registration accuracy measurement mark of the present invention, the observation light of the fifth and sixth sidewalls exist in a region sandwiched by the observation light of the first and second sidewalls, and the observation light of the third and fourth sidewalls exist in a region sandwiched by the observation light of the seventh and eighth sidewalls.

Therefore, the correspondence of observation light with respect to a sidewall can easily be identified at the measurement process of registration accuracy according to observation light. The registration accuracy can be measured properly.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view of a registration accuracy measurement mark according to a first embodiment of the present invention.

FIG. 2 relates to FIG. 1, and (a) is a sectional view in the direction of the arrow A–A' and (b) shows a detection signal thereof.

FIG. 5 relates to FIG. 4, and (a) is a sectional view in the direction of the arrow A–A', and (b) shows a detection signal thereof.

FIG. 6 relates to FIG. 4, and (a) is a sectional view in the direction of the arrow B–B', and (b) is a detection signal thereof.

FIG. 17 relates to FIG. 16, and (a) is a sectional view in the direction of the arrow of A–A', and (b) shows a detection signal thereof.

FIG. 18 relates to FIG. 16, and (a) is a sectional view in the direction of the arrow of B–B', and (b) shows a detection signal thereof.

DESCRIPTION OF THE PREFERRED EMBODIMENTS

First Embodiment

The registration accuracy measurement mark of the present embodiment is formed in a region peripheral to a semiconductor device similar to that of conventional art.

Figure 3:
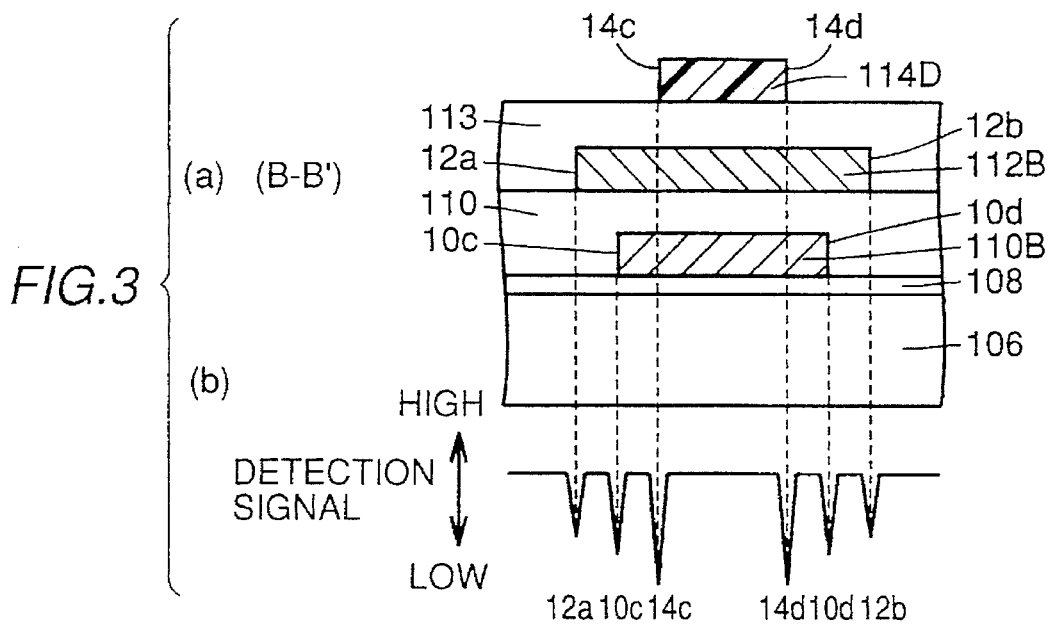
FIG. 3 relates to FIG. 1, and (a) is a sectional view in the direction of the arrow B–B', and (b) shows a detection signal thereof.

First, the structure of a registration accuracy measurement mark will be described with reference to FIGS. 1–3. A first measurement mark 110B is formed above a semiconductor substrate 106 with a gate oxide film 108 therebetween. First measurement mark 110B has a plane configuration of a rectangular pattern including a first sidewall 10a and a second sidewall 10b disposed along the Y direction in parallel to each other with a predetermined distance therebetween.

A second measurement mark 112B is formed above first measurement mark 110B with an interlayer oxide film 110 therebetween. Second measurement mark 112B has a plane configuration of a rectangular pattern including a third sidewall 12a and a fourth sidewall 12b disposed in parallel along the X direction with a predetermined distance between.

A third measurement mark 114D is formed above second measurement mark 112B with an interlayer oxide film 113 therebetween. Third measurement mark 114D has a plane configuration of a square pattern including a fifth sidewall 14a and a sixth sidewall 14b in parallel with a predetermined distance therebetween along the Y direction, and disposed between first and second sidewalls 10a and 10b, and a seventh sidewall 14c and an eighth sidewall 14d disposed in parallel with a predetermined distance therebetween along the Y direction, and between third and fourth sidewalls 12a and 12b.

The registration accuracy measurement of first, second, and third measurement marks 110b, 112b, and 114d irradiated with observation light will be described with reference to FIGS. 2(b) and 3(b).

First, the registration accuracy measurement of first and third measurement marks 110B and 114D will be described.

Referring to FIG. 2(b), detection signals are observed according to first sidewall 10a, second sidewall 10b, fifth sidewall 14a and sixth sidewall 14b. Similar to the prior art, the middle point of first and second sidewalls 10a and 10b and the middle point of fifth and sixth sidewalls 14a and 14b are obtained according to the detection signals. By comparing the positions of these middle points, the registration accuracy of first and third measurement marks 110B and 114D in the X direction can be measured.

At the same time, a similar measurement can be carried out for second and third measurement marks 112B and 114D. Referring to FIG. 3(b), detection signals according to third sidewall 12a, fourth sidewall 12b, seventh sidewall 14c and eighth sidewall 14d are obtained. The middle point of third and fourth sidewalls 12a and 12b, and the middle point of seventh and eighth sidewalls 14c and 14d are obtained according to the observed detection signals. By comparing the positions of these middle points, the registration accuracy of the second and third measurement marks 112B and 114D in the Y direction can be measured.

According to the first embodiment, the registration accuracy in the X and Y directions of different layers can be measured by one irradiation step of observation light. Therefore, the time required for measuring registration accuracy can be reduced.

Furthermore, the observation light of the fifth and sixth sidewalls exist in a region sandwiched by the observation light of the first and second sidewalls, and the observation light of the seventh and eighth sidewalls exist in a region sandwiched by the observation light of the third and fourth sidewalls. Therefore, correspondence of observation light to a sidewall can easily be identified in the measurement process of the registration accuracy by the observation light. Therefore, registration accuracy can be measured properly.

Furthermore, since first, second, and third measurement marks 110B, 112B and 114D are formed in a layered manner, the space required for forming a registration accuracy mark at a region peripheral to the semiconductor device can be reduced.

Second Embodiment

Figure 4:
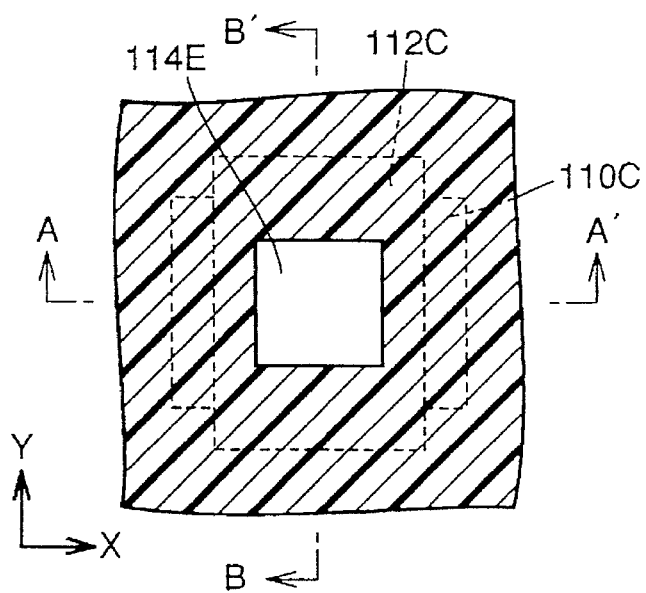
FIG. 4 is a plan view of a registration accuracy measurement mark according to a second embodiment of the present invention.

A structure of a registration accuracy measurement mark according to a second embodiment will be described hereinafter with reference to FIGS. 4–6.

A first measurement mark 110C is formed above a semiconductor substrate 106 with a gate oxide film 108 therebetween. First measurement mark 110C has a plane configuration of a rectangle opening measurement pattern including a first sidewall 10a and a second sidewall 10b arranged in parallel with a predetermined distance therebetween along the Y direction.

A second measurement mark 112C is formed above first measurement mark 110C with an interlayer oxide film 110C therebetween. Second measurement mark 112C has a plane configuration of a rectangle opening measurement pattern including a third sidewall 12a and a fourth sidewall 12b disposed in parallel with a predetermined distance therebetween along the X direction.

A third measurement mark 114E is formed above second measurement mark 112C with an interlayer oxide film 113 therebetween. Third measurement mark 114E has a plane configuration of a square opening measurement pattern including a fifth sidewall 14a and a sixth sidewall 14b disposed in parallel with a predetermined distance therebetween along the Y direction, and between first and second sidewalls 10a and 10b, and a seventh sidewall 14c and an eighth sidewall 14d disposed parallel to each other with a predetermined distance therebetween along the X direction, and between third and fourth sidewalls 12a and 12b.

The measurement of registration accuracy when first, second and third measurement patterns 110C, 112C and 114E are irradiated with observation light is carried out similar to the first embodiment on the basis of detection signals as shown in FIGS. 5(b) and 6(b). Therefore, the registration accuracy in X and Y directions of different layers can be measured by one emission of observation light. Therefore, the time required for measuring registration accuracy can be reduced.

Also, the observation light of the fifth and sixth sidewalls exist in a region sandwiched by the observation light of the first and second sidewalls, and the observation light of the seventh and eighth sidewalls exist in a region sandwiched by the observation light of the third and fourth sidewalls. Therefore, correspondence of observation light to a sidewall is easily identified in measuring the registration accuracy by observation light. Thus, the registration accuracy can be measured properly.

Third Embodiment

Figure 7:
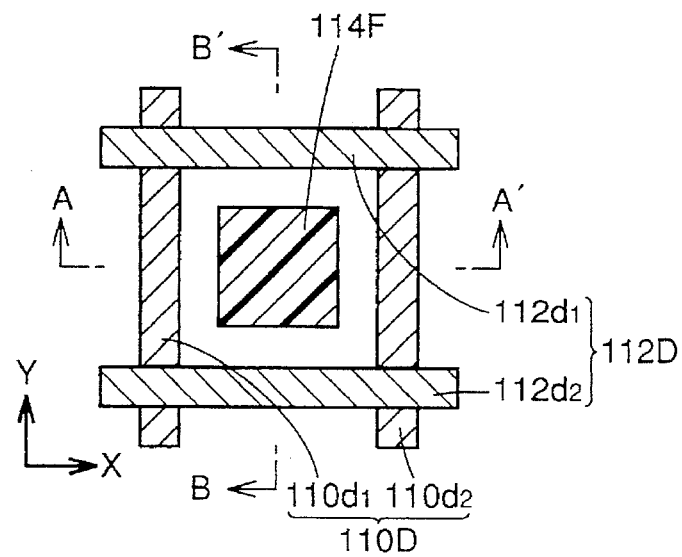
FIG. 7 is a plan view of a registration accuracy measurement mark according to a third embodiment of the present invention.
Figure 8:
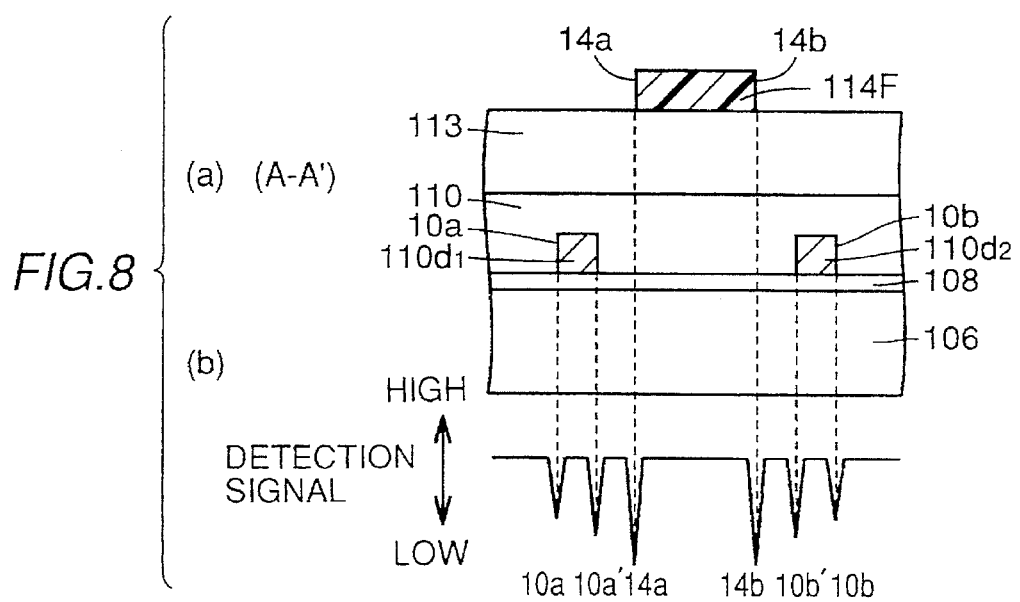
FIG. 8 relates to FIG. 7, and (a) is a sectional view in the direction of the arrow A–A', and (b) shows a detection signal thereof.
Figure 9:
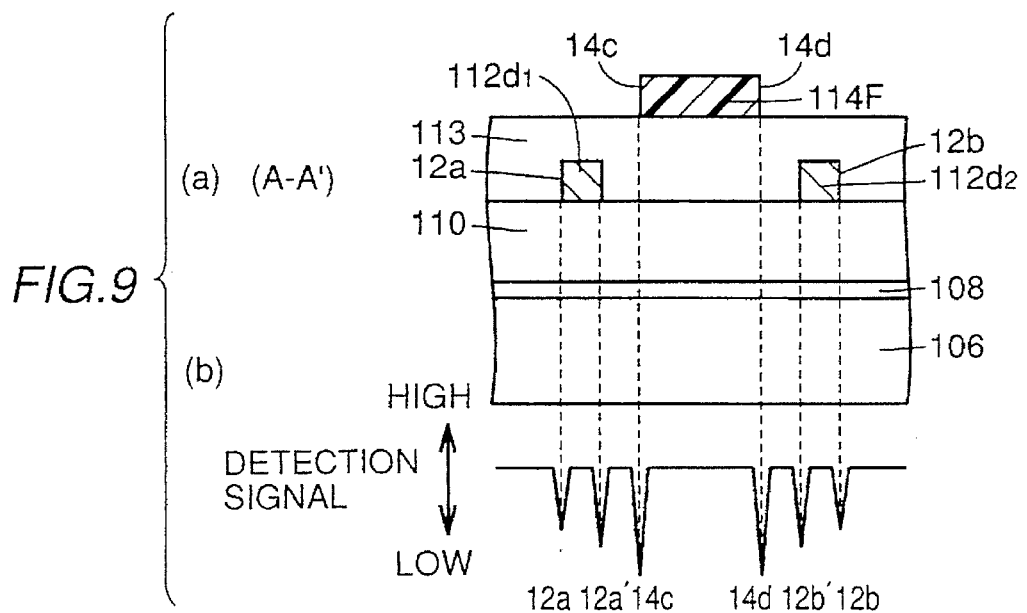
FIG. 9 relates to FIG. 7, and (a) is a sectional view in the direction of the arrow of B–B', and (b) shows a detection signal thereof.

A structure of a registration accuracy measurement mark according to a third embodiment of the present invention will be described with reference to FIGS. 7–9.

A first measurement mark 110D is formed above a semiconductor substrate 106 with a gate oxide film 108 therebetween. First measurement mark 110D has a first measurement pattern $110d_1$ of substantially a rectangle including a first sidewall 10a, and a second measurement pattern $110d_2$ of substantially a rectangle including a second sidewall 10b disposed in parallel with a predetermined distance therebetween along the Y direction.

A second measurement 112D is formed above first measurement mark 110D with an interlayer oxide film 110 therebetween. Second measurement mark 112D has a third measurement pattern $112d_1$ of substantially a rectangle including a third sidewall 12a, and a fourth measurement pattern $112d_2$ of substantially a rectangle including a fourth sidewall 12b disposed in parallel along the X direction with a predetermined distance therebetween.

A third measurement mark 114F is formed above second measurement mark 112D with an interlayer oxide film 113 therebetween. Third measurement mark 114F has a plane configuration of a square pattern including a fifth sidewall 14a and a sixth sidewall 14b disposed in parallel with a predetermined distance therebetween along the Y direction, and disposed between the first and second sidewalls 10a and 10b, and a seventh sidewall 14c and an eighth sidewall 14d disposed in parallel with a predetermined distance therebetween along the X direction, and between third and fourth sidewalls 12a and 12b.

The measurement of registration accuracy when first, second, and third measurement marks 110D, 112D and 114F are irradiated with observation light will be described with reference to FIG. 8(b) and 9(b).

The measurement registration accuracy between first and third measurement marks 110D and 114F will be described with reference to FIG. 8(b). Detection signals are observed corresponding to first, second, fifth, and sixth sidewalls 10a, 10b, 14a, and 14b. The middle point of the observation light of first and second sidewalls 10a and 10b, and the middle point of the observation light of fifth and sixth sidewalls 14a and 14b are obtained. By comparing the positions of these middle points, the registration accuracy of first and third measurement marks 110D and 114F in the X direction can be assessed. A similar measurement can be carried out using the middle point of the observation light of first and second sidewalls 10a' and 10b' regarding first measurement mark 110B.

Also at the same time, the registration accuracy between second and third measurement marks 112D and 114F can be measured. As shown in FIG. 9(b), detection signals according to third sidewall 12a, fourth sidewall 12b, seventh sidewall 14c and eighth sidewall 14d are observed. The middle point of third and fourth sidewalls 12a and 12b, and the middle point of seventh and eighth sidewalls 14c and 14d are obtained according to the observed detection signals. By comparing the positions of these middle points, the registration accuracy in the Y direction of second and third measurement patterns 112D and 114F can be measured. A similar registration accuracy can be measured using the position of the middle point of the detection signals of third and fourth sidewalls 12a' and 12b'.

According to the third embodiment, measurement of registration accuracy in X and Y directions of different layers can be carried out by one emission of observation light. Therefore, the time required for measuring registration accuracy can be reduced.

Furthermore, the observation light of the fifth and sixth sidewalls exist in a region sandwiched by the observation light of the first and second sidewalls, and the observation light of the seventh and eighth sidewalls exist in a region sandwiched by the observation light of the third and fourth sidewalls. Therefore, correspondence of observation light with respect to a sidewall is easily identified in measuring the registration accuracy with observation light. Therefore, measurement of observation light can be carried out properly.

Since first, second, and third measurement marks 110D, 112D, and 114F are formed in a layered manner, the space required for forming these registration accuracy measurement marks at a peripheral region of the semiconductor device can be reduced.

Fourth Embodiment

Figure 10:
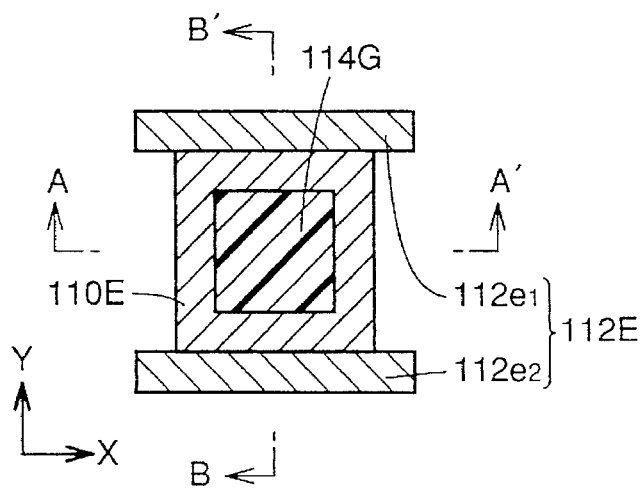
FIG. 10 is a plan view of a registration accuracy measurement mark according to a fourth embodiment of the present invention.
Figure 11:
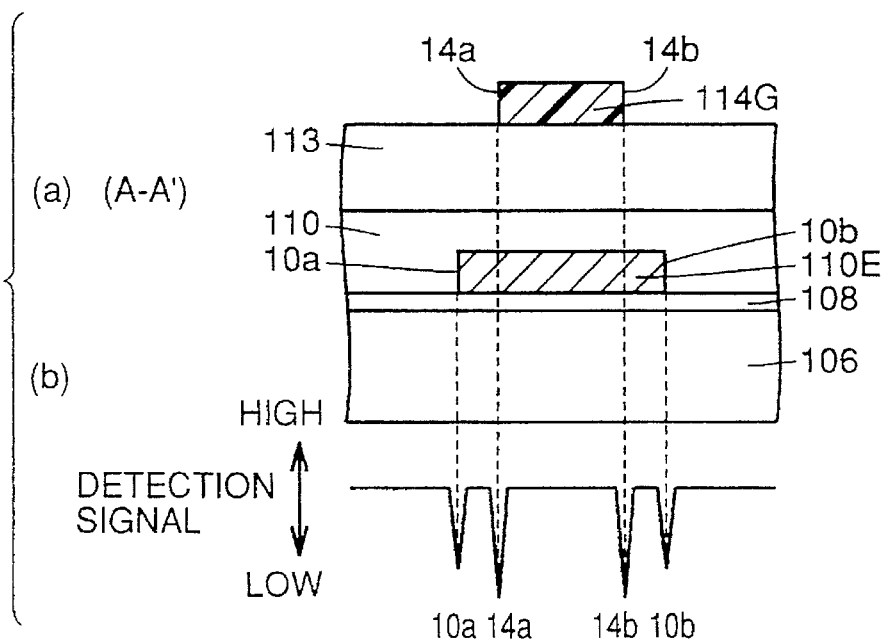
FIG. 11 relates to FIG. 10, and (a) is a sectional view in the direction of the arrow of A–A', and (b) shows a detection signal thereof.
Figure 12:
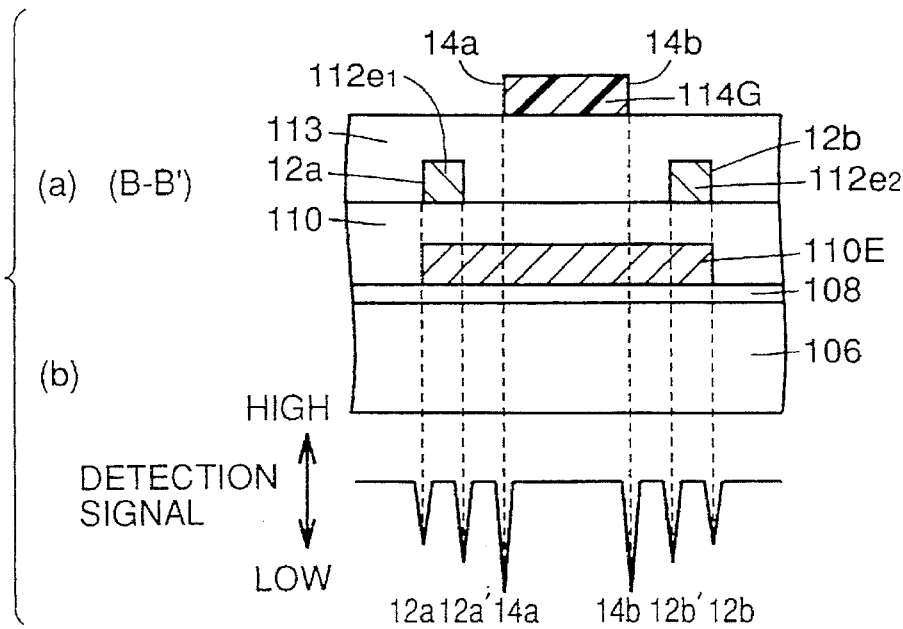
FIG. 12 relates to FIG. 10, and (a) is a sectional view in the direction of the arrow of B–B', and (b) shows a detection signal thereof.

A structure of a registration accuracy measurement mark of a fourth embodiment will be described with reference to FIGS. 10–12.

A first measurement mark 110E is formed above a semiconductor substrate 106 with a gate oxide film 108 therebetween. First measurement mark 110E has a plane configuration of a rectangular measurement pattern including a first sidewall 10a and a second sidewall 10b disposed in parallel along the Y direction with a predetermined distance therebetween.

A second measurement mark 112E is formed above first measurement mark 110E with an interlayer oxide film 110 therebetween. Second measurement mark 112E has a first measurement pattern $112e_1$ of substantially a rectangle including a third sidewall 12a and a second measurement pattern $112e_2$ of substantially a rectangle including a fourth sidewall 12b. Third and fourth sidewalls 12a and 12b are disposed in parallel along the X direction with a predetermined distance therebetween.

A third measurement mark 114G is formed above second measurement mark 112E with an interlayer oxide film 113 therebetween. Third measurement mark 114G has a plane configuration of a square pattern including a fifth sidewall 14a and a sixth sidewall 14b disposed in parallel with a predetermined distance therebetween along the Y direction, and between first and second sidewalls 10a and 10b, and a seventh sidewall 14c and an eighth sidewall 14d arranged in parallel with a predetermined distance along the X direction, and between third and fourth sidewalls 12a and 12b.

Measurement of registration accuracy of first, second, and third measurement marks 110E, 112E and 114G irradiated with observation light will be described hereinafter. Referring to FIG. 11(b), detection signals according to first sidewall 10a, second sidewall 10b, fifth sidewall 14a, and sixth sidewall 14b are observed. The middle point of first and second sidewalls 10a and 10b, and the middle point of fifth and sixth sidewalls 14a and 14b are obtained according to the observed detection signals. By comparing the positions of these middle points, measurement of registration accuracy of first and third measurement marks 110E and 114G in the X direction can be carried out.

At the same time, the registration accuracy of second and third measurement marks 112E and 114G can also be carried out. Referring to FIG. 12(b), detection signals are observed according to third sidewall 12a, fourth sidewall 12b, seventh sidewall 14c and sixth sidewall 14d. The middle point of third and fourth sidewalls 12a and 12b, and the middle point of seventh and eighth sidewalls 14c and 14d are obtained according to the detection signals. By comparing the positions of these middle points, measurement of registration accuracy of second and third measurement marks 112E and 114G in the X direction can be carried out. A similar registration accuracy measurement can be carried out on the basis of the position of the middle point of the detection signals of third and fourth sidewalls 12a' and 12b'.

According to the present fourth embodiment, measurement of registration accuracy in both the X and Y directions of different layers can be carried out at one time by observation light. Therefore, the time required for measuring registration accuracy can be reduced.

Furthermore, the observation light of the fifth and sixth sidewalls exist in a region sandwiched by the observation light of the first and second sidewalls, and the observation light of the seventh and eighth sidewalls exist in a region sandwiched by the observation light of the third and fourth sidewalls. Therefore, the correspondence of observation light with respect to a sidewall is easily identified in measuring the registration accuracy with observation light. Measurement of observation light can be carried out properly.

Furthermore, since first measurement mark 110E, second measurement mark 112E, and third measurement mark 114E are formed in a layered manner, the region required for forming registration accuracy measurement marks at a peripheral region of a semiconductor device can be reduced.

Fifth Embodiment

Figure 13:
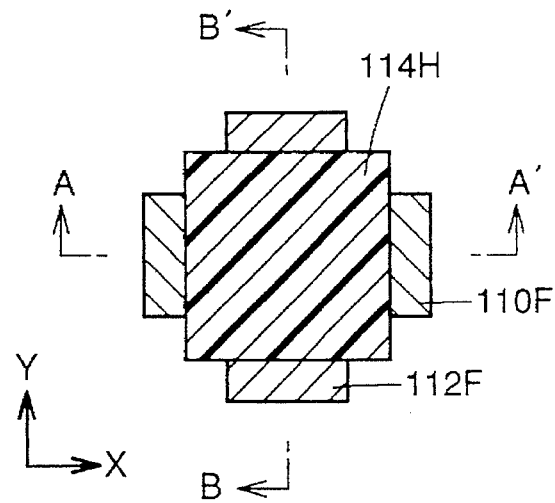
FIG. 13 is a plan view of a registration accuracy measurement mark according to a fifth embodiment of the present invention.
Figure 14:
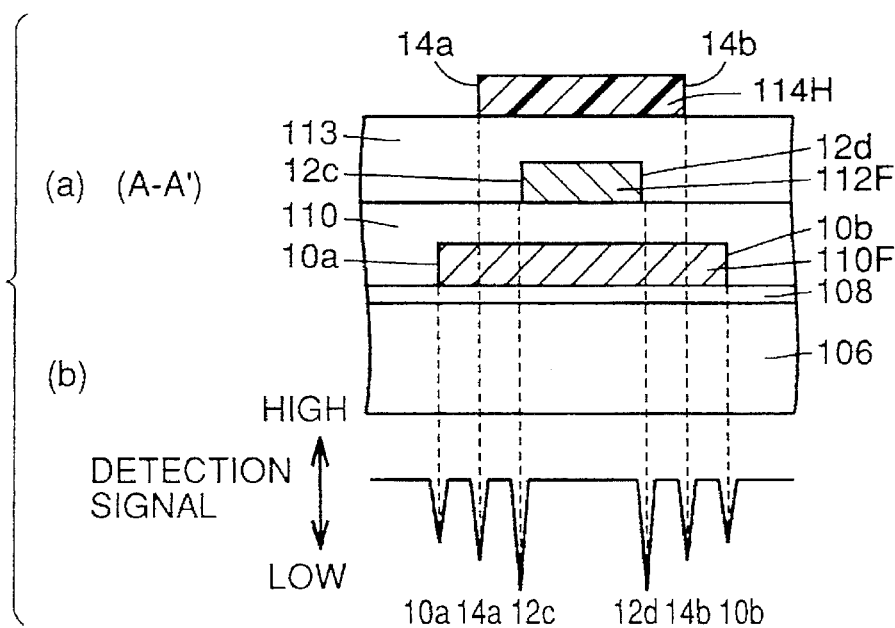
FIG. 14 relates to FIG. 13, and (a) is a sectional view in the direction of the arrow A–A', and (b) shows a detection signal thereof.
Figure 15:
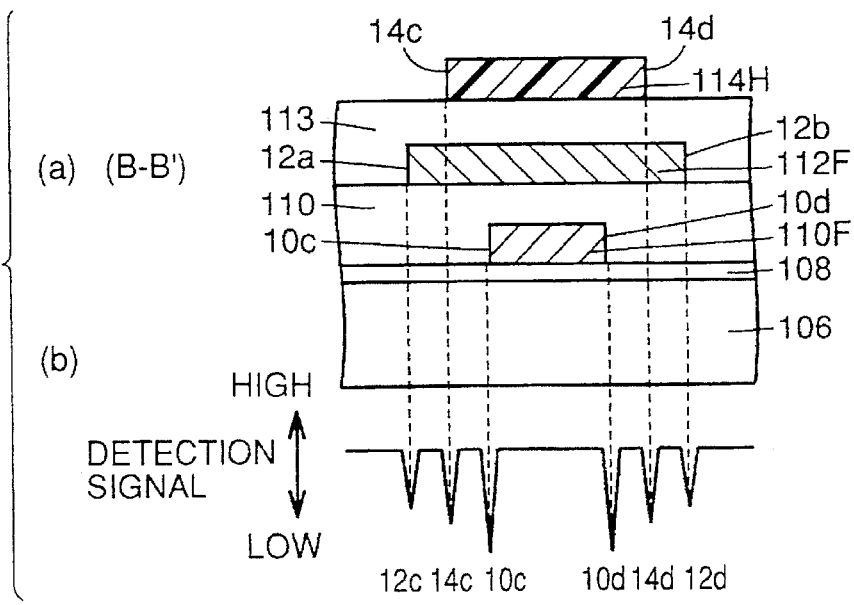
FIG. 15 relates to FIG. 13, and (a) is a sectional view in the direction of the arrow of B–B', and (b) shows a detection signal thereof.

A registration accuracy measurement mark according to a fifth embodiment of the present invention will be described hereinafter with reference to FIGS. 13–15.

A first measurement mark 110F is formed above a semiconductor substrate 106 with a gate oxide film 108 therebetween. First measurement mark 110F has a plane configuration of a rectangular measurement pattern including a first sidewall 10a and a second sidewall 10b disposed in parallel along the Y direction with a predetermined distance therebetween.

A second measurement mark 112F is formed above first measurement mark 110F with an interlayer oxide film 110 therebetween. Second measurement mark 112F has a plane configuration of a rectangular measurement pattern including a third sidewall 12a and a fourth sidewall 12b disposed in parallel along the X direction with a predetermined distance therebetween.

A third measurement mark 114H is formed above second measurement mark 112F with an interlayer oxide film 113 therebetween. Third measurement mark 114 has a plane configuration of a square pattern including a fifth sidewall 14a and a sixth sidewall 14b disposed in parallel along the Y direction with a predetermined distance therebetween, and between first and second sidewalls 10a and 10b, and a seventh sidewall 14c and an eighth sidewall 14d formed in parallel with a predetermined distance therebetween along the X direction, and between third and fourth sidewalls 12a and 12b.

Measurement of registration accuracy when first measurement mark 110F, second measurement mark 112F, and third measurement mark 114H are irradiated with observation light is carried out by obtaining detection signals similar to those detected in the first or second embodiments, as shown in FIGS. 14(b) and 15(b). Therefore, an effect similar to those of the first and second embodiments can be obtained in the present fifth embodiment.

Sixth Embodiment

Figure 16:
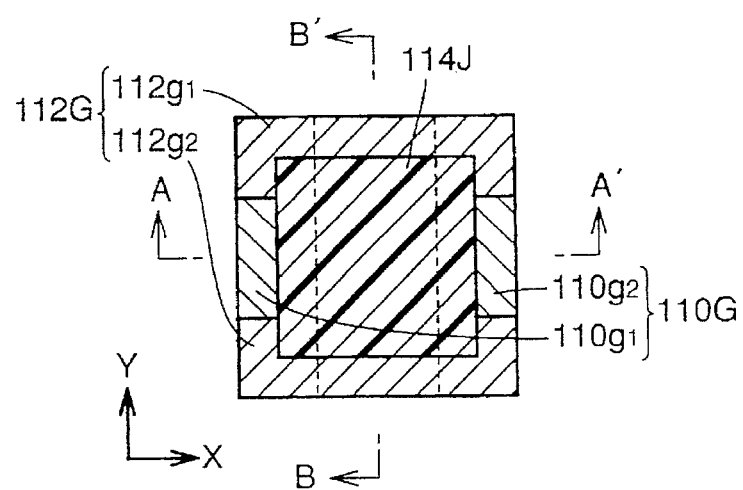
FIG. 16 is a plan view of a registration accuracy measurement mark according to a sixth embodiment of the present invention.

A registration accuracy measurement mark according to a sixth embodiment of the present invention will be described with reference to FIGS. 16–18.

A first measurement mark 110G is formed above a semiconductor substrate 106 with a gate oxide film 108 therebetween. First measurement mark 110G has a first measurement pattern $110g_1$ of substantially a rectangle including a first sidewall 10a and a second measurement pattern $110g_2$ of substantially a rectangle including a second sidewall 10b. First and second sidewalls 10a and 10b are formed in parallel along the Y direction with a predetermined distance therebetween.

A second measurement mark 112G is formed above first measurement mark 110G with an interlayer oxide film 110 therebetween. Second measurement mark 112G has a third measurement pattern $112g_1$ of substantially a rectangle including a third sidewall 12a, and a fourth measurement pattern $112g_2$ of substantially a rectangle including a fourth sidewall 12b. Third and fourth sidewalls 12a and 12b are disposed in parallel along the X direction with a predetermined distance therebetween.

A third measurement mark 114J is formed above second measurement mark 112G with an interlayer oxide film 113 therebetween. Third measurement mark 114J has plane configuration of a square pattern including a fifth sidewall 14a and a sixth sidewall 14d disposed with a predetermined distance therebetween in parallel along Y direction, and between first and second sidewalls 10a and 10b, and a seventh sidewall 14c and an eighth sidewall 14d disposed with a predetermined distance therebetween in parallel along the X direction, and between third and fourth sidewalls 12a and 12b.

Detection signals when first measurement mark 110G, second measurement mark 112G, and third measurement mark 114J are irradiated with observation light are obtained as shown in FIG. 17 and 18, similar to those of the third embodiment. Therefore, an effect similar to that of the third embodiment can be obtained in the present sixth embodiment.

Seventh Embodiment

Figure 19:
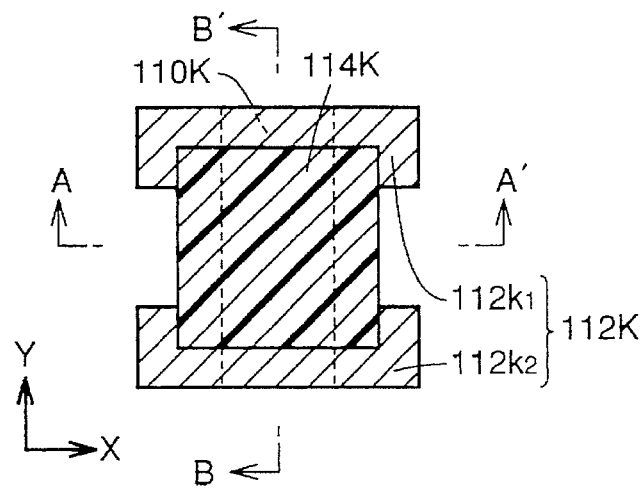
FIG. 19 is a plan view of a registration accuracy measurement mark according to a seventh embodiment of the present invention.
Figure 20:
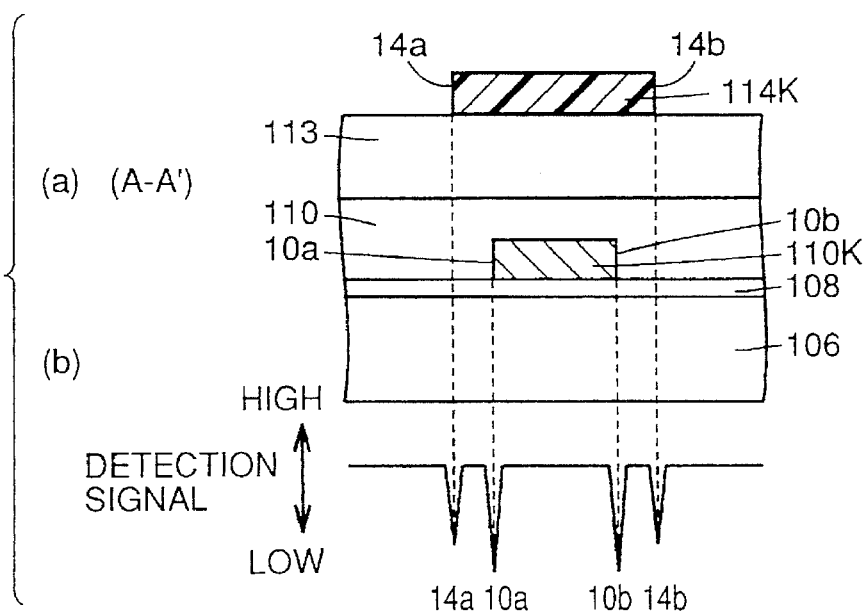
FIG. 20 relates to FIG. 19, and (a) is a sectional view in the direction of the arrow A–A', and (b) shows a detection signal thereof.
Figure 21:
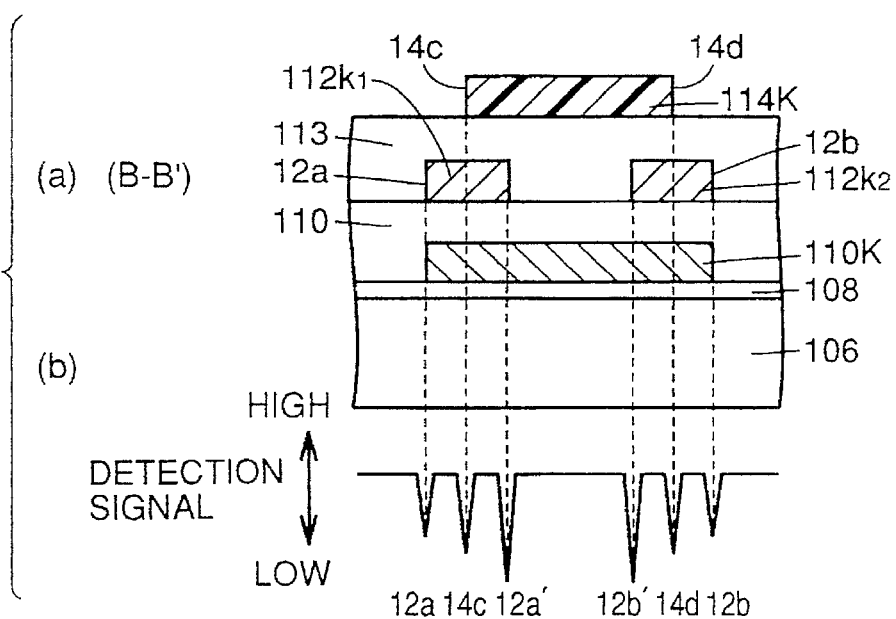
FIG. 21 relates to FIG. 19, and (a) is a sectional view in the direction of the arrow of B–B', and (b) shows a detection signal thereof.
Figure 22:
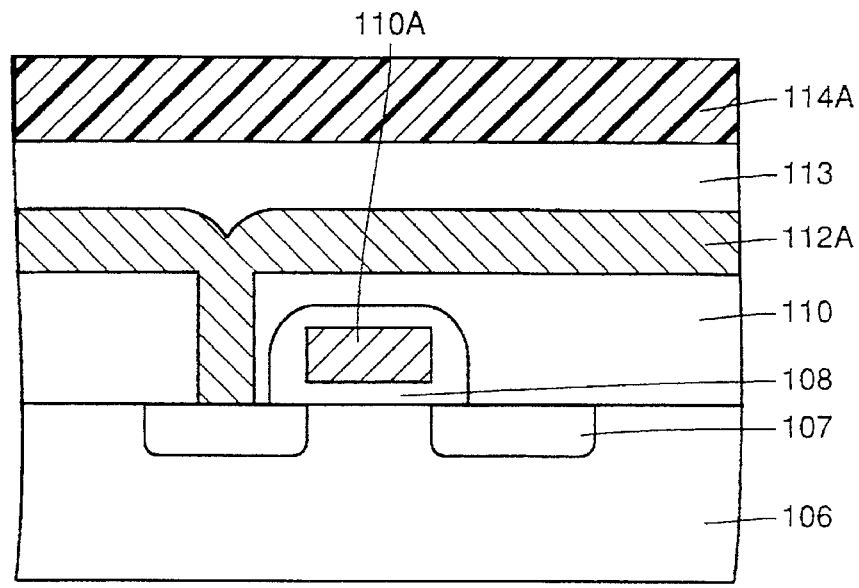
FIG. 22 is a vertical sectional view showing a structure of an MOS transistor according to the conventional art.
Figure 23:
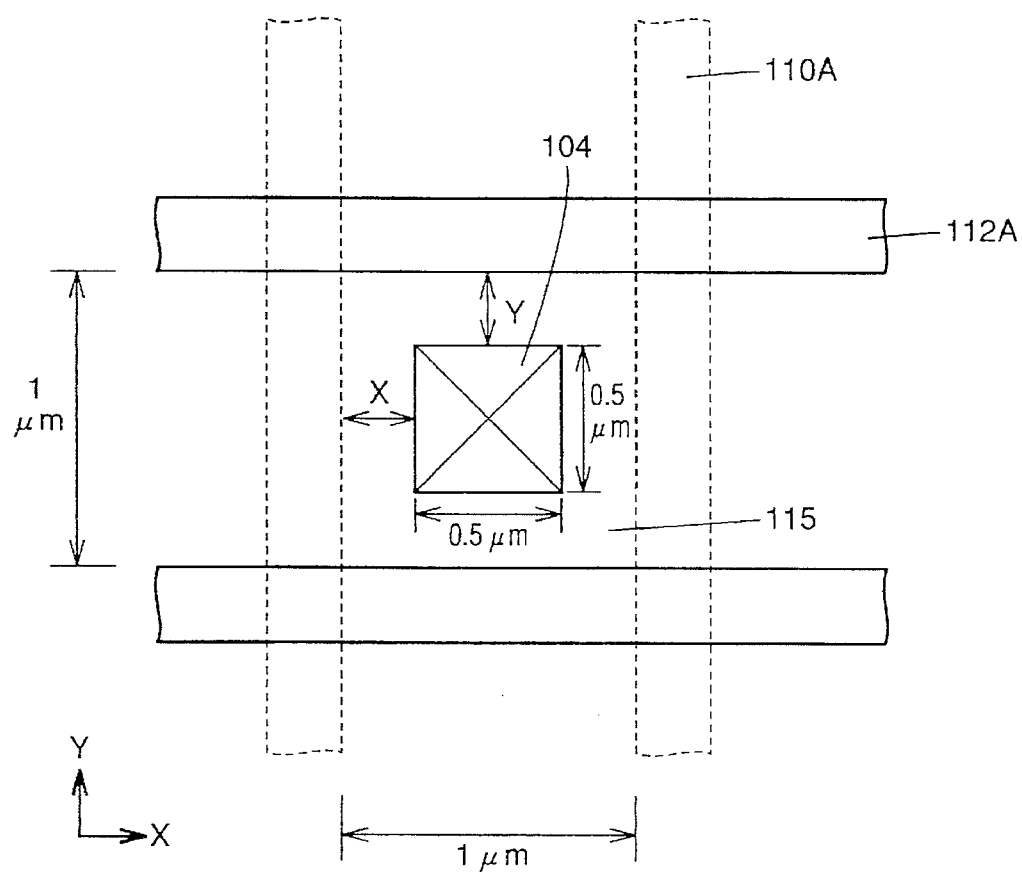
FIG. 23 shows a plan view where a contact hole is formed in a region defined by word lines and bit lines according to the conventional art.
Figure 24:
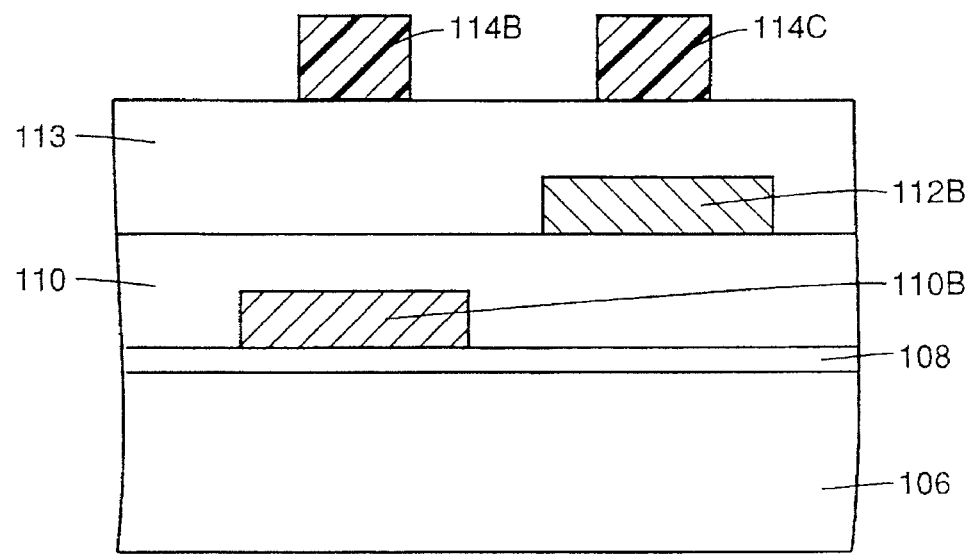
FIG. 24 is a sectional view showing a structure of a registration accuracy measurement mark according to the conventional art.
Figure 25:
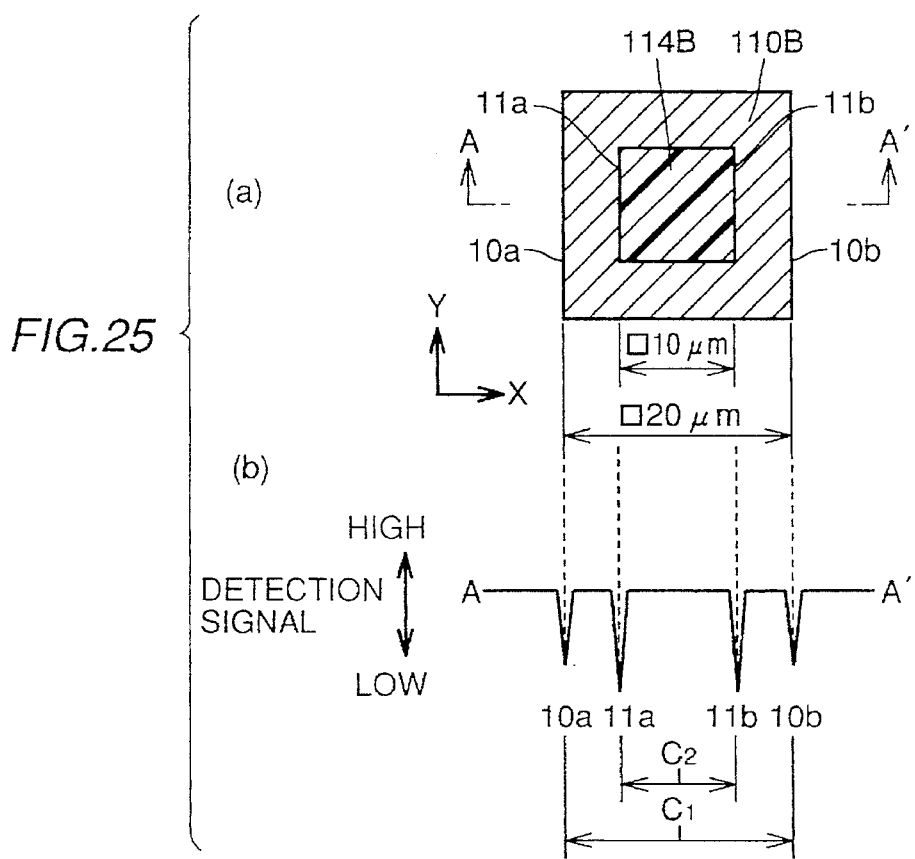
FIG. 25(a) shows a first plan view of a registration accuracy measurement mark according to the conventional art, and (b) shows a detection signal taken along the arrow A–A' thereof.
Figure 26:
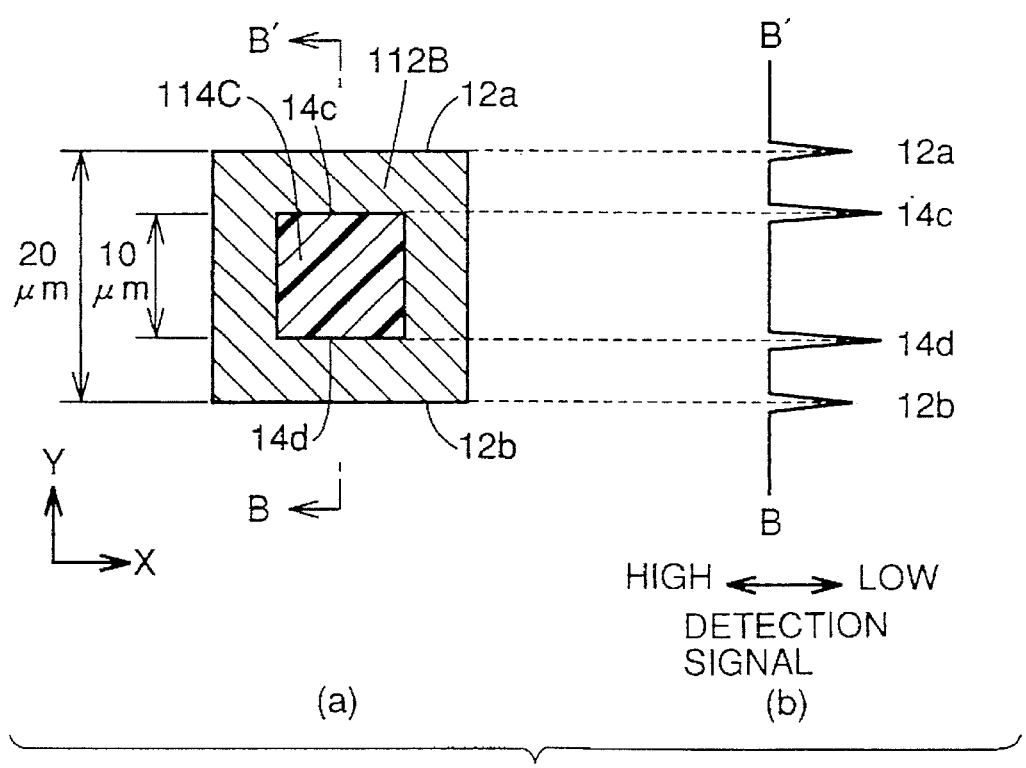
FIG. 26 is a second plan view of a registration accuracy measurement mark according to the conventional art, and (b) shows a detection signal taken along the arrow of B–B' of (a).

A registration accuracy measurement mark of a seventh embodiment will be described hereinafter with reference to FIGS. 19–21.

A first measurement mark 110K is formed above a semiconductor substrate 106 with a gate oxide film 108 therebetween. First measurement mark 110K has a plane configuration of a rectangular measurement pattern including a first sidewall 10a and a second sidewall 10b disposed in parallel with a predetermined distance therebetween along the Y direction.

A second measurement mark 112K is formed above first measurement mark 110K with an interlayer oxide film 110 therebetween. Second measurement mark 112K has a first measurement pattern $110k_1$ of substantially a rectangle including a third sidewall 12a, and a second measurement pattern $112k_2$ of substantially a rectangle including a fourth sidewall 12b. Third and fourth sidewalls 12a and 12b are arranged in parallel along the X direction with a predetermined distance therebetween.

A third measurement mark 114K is formed above second measurement mark 112K with an interlayer oxide film 113 therebetween. Third measurement mark 114K has a plane configuration of a square measurement pattern including a fifth sidewall 14a and a sixth sidewall 14b disposed in parallel with a predetermined distance therebetween along the Y direction, and disposed outside of first and second sidewalls 10a and 10b, and a seventh sidewall 14c and an eighth sidewall 14d formed in parallel with a predetermined distance therebetween along the X direction, and between third and fourth sidewalls 12a and 12b.

Measurement of registration accuracy when first measurement mark 110K, second measurement mark 112K, and third measurement mark 114K are irradiated with observation light will be described with reference to FIGS. 20(b) and 21(b).

Detection signals according to first sidewall 10a, second sidewall 10b, and fifth paragraph 14a, sixth sidewall 14b are observed as shown in FIG. 20(b). The middle point of first and second sidewalls 10a and 10b, and the middle point of fifth and sixth sidewalls 14a and 14b are obtained. By comparing the positions of these middle points, measurement of registration accuracy of first and third measurement marks 110K and 114K in the X direction can be carried out.

Also at the same time, measurement of the registration accuracy of second and third measurement marks 112K and 114K in the Y direction can also be carried out. Referring to FIG. 21(b), detection signals according to third sidewall 12a, fourth sidewall 12b, seventh sidewall 14c and eighth sidewall 14d are detected. By obtaining the middle point of third and fourth sidewalls 12a and 12b, and the middle point of seventh sidewall and eighth sidewalls 14c and 14d from the observed detection signals, and comparing the positions of these middle points, the registration accuracy of second and third measurement marks 112K and 114K can be measured in the Y direction.

According to the seventh embodiment, measurement of the registration accuracy in X and Y directions of different layers can be carried out by one irradiation step of observation light. Therefore, the time required for measuring the registration accuracy can be reduced.

When observation light is directed, the observation light of the first and second sidewalls exist in a region sandwiched by the observation light of the fifth and sixth sidewall. The observation light of the seventh and eighth sidewalls exist in a region sandwiched by the observation light of the third and fourth sidewalls. Therefore, correspondence of observation light with a sidewall can easily be identified in measuring the registration accuracy by the observation light. Measurement of the observation light can be carried out properly.

Since first measurement mark 110K, second measurement mark 112K, and third measurement mark 114K are formed in a layered manner, the space required for forming registration accuracy measurement marks can be reduced in a peripheral region of a semiconductor device.

According to an aspect of a registration accuracy measurement mark of the present invention, measurement of registration accuracy in X and Y directions of different layers can be carried out by one irradiation step of observation light. Therefore, the time required for registration accuracy measurement can be reduced. The time for manufacturing a semiconductor device can be reduced.

According to another aspect of a registration accuracy measurement mark of the present invention, correspondence of observation light with respect to a sidewall can be easily identified in measuring the registration accuracy by observation light. Therefore, measurement of registration accuracy can be carried out properly. Thus, a reliable registration accuracy measurement can be carried out.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A registration accuracy measurement mark comprising:
    a first measurement mark formed in a first layer on a semiconductor substrate,
    a second measurement mark formed above said first measurement mark in a second layer on said first layer, and
    a third measurement mark formed substantially above said first measurement mark and said second measurement mark, and formed in a third layer on said second layer, used together with said first registration mark for measuring the offset between said first layer and said third layer in an X direction, and used together with said second measurement mark for measuring the offset between said second layer and said third layer in a Y direction,
    wherein
        said first measurement mark includes a first sidewall and a second sidewall disposed in parallel with a first distance therebetween along said Y direction,
        said second measurement mark includes a third sidewall and a fourth sidewall disposed in parallel with a second distance therebetween along said X direction, and
        said third measurement mark includes a fifth sidewall and a sixth sidewall disposed in parallel with a third distance different from said first distance therebetween along said Y direction, and a seventh sidewall and an eighth sidewall disposed in parallel with a fourth distance different from said second distance therebetween along said X direction.

2. A registration accuracy measurement mark, comprising:
    a first measurement mark formed in a first layer on a semiconductor substrate,
    a second measurement mark formed above said first measurement mark in a second layer on said first layer, and
    a third measurement mark formed substantially above said first measurement mark and said second measurement mark, and formed in a third layer on said second layer, used together with said first registration mark for measuring the offset between said first layer and said third layer in an X direction, and used together with said second measurement mark for measuring the offset between said second layer and said third layer in a Y direction, wherein
        said first measurement mark includes a first sidewall and a second sidewall disposed in parallel with a first distance therebetween along said Y direction,
        said second measurement mark includes a third sidewall and a fourth sidewall disposed in parallel with a second distance therebetween along said X direction, and
        said third measurement mark includes a fifth sidewall and a sixth sidewall disposed in parallel with a third distance different from said first distance therebetween along said Y direction, and a seventh sidewall and an eighth sidewall disposed in parallel with a fourth distance different from said second distance therebetween along said X direction,
    wherein said third measurement mark has said fifth sidewall and said sixth sidewall disposed in a region sandwiched by said first sidewall and said second sidewall of said first registration mark, and
    wherein said third registration mark has said seventh sidewall and said eighth sidewall disposed in a region sandwiched by said third sidewall and said fourth sidewall of said second measurement mark.

3. The registration accuracy measurement mark according to claim 1, wherein said third measurement mark has said fifth sidewall and said sixth sidewall disposed in a region sandwiched by said first sidewall and said second sidewall of said first measurement mark,
    wherein said second measurement mark has said third sidewall and said fourth sidewall arranged in a region sandwiched by said seventh sidewall and said eighth sidewall of said third measurement mark.

4. The registration accuracy measurement mark according to claim 2, wherein
    said first measurement mark has a measurement pattern of substantially a rectangle defined by said first sidewall and said second sidewall,
    said second measurement mark has a measurement pattern of substantially a rectangle defined by said third sidewall and said fourth sidewall, and
    said third measurement mark has a measurement pattern of substantially a square defined by said fifth sidewall, said sixth sidewall, said seventh sidewall and said eighth sidewall.

5. The registration accuracy measurement mark according to claim 2, wherein
    said first measurement mark has an opening measurement pattern of substantially a rectangle defined by said first sidewall and said second sidewall,
    said second measurement mark has an opening measurement pattern of substantially a rectangle defined by said third sidewall and said fourth sidewall, and
    said third measurement mark has an opening measurement pattern of substantially a square defined by said fifth sidewall, said sixth sidewall, said seventh sidewall and said eighth sidewall.

6. The registration accuracy measurement mark according to claim 2, wherein said first measurement mark has a first measurement pattern of substantially a rectangle including said first sidewall, and a second measurement pattern of substantially a rectangle including said second sidewall, said second measurement mark has a third measurement pattern of substantially a rectangle including said third sidewall, and a fourth measurement pattern of substantially a rectangle including said fourth sidewall, and said third measurement mark has a fifth measurement pattern of substantially a square defined by said fifth sidewall, said sixth sidewall, said seventh sidewall and said eighth sidewall.

7. The registration accuracy measurement mark according to claim 2, wherein said first measurement mark has a second measurement pattern of substantially a rectangle defined by said first sidewall and said second sidewall, said second measurement mark has a first measurement pattern of substantially a rectangle including said first sidewall, and a second measurement pattern of substantially a rectangle including said second sidewall, and said third measurement mark has a fourth measurement pattern of substantially a square defined by said fifth sidewall said sixth sidewall, said seventh sidewall, and said eighth sidewall.

* * * * *